United States Patent
Tajalli et al.

(10) Patent No.: US 11,183,983 B2
(45) Date of Patent: Nov. 23, 2021

(54) PROGRAMMABLE CONTINUOUS TIME LINEAR EQUALIZER HAVING STABILIZED HIGH-FREQUENCY PEAKING FOR CONTROLLING OPERATING CURRENT OF A SLICER

(71) Applicant: Kandou Labs, S.A., Lausanne (CH)

(72) Inventors: Armin Tajalli, Salt Lake City, UT (US); Christoph Walter, Lausanne (CH)

(73) Assignee: KANDOU LABS, S.A., Lausanne (CH)

( * ) Notice: Subject to any disclaimer, the term of this patent is extended or adjusted under 35 U.S.C. 154(b) by 118 days.

(21) Appl. No.: 16/566,572

(22) Filed: Sep. 10, 2019

(65) Prior Publication Data

US 2020/0083854 A1 Mar. 12, 2020

Related U.S. Application Data

(60) Provisional application No. 62/729,404, filed on Sep. 10, 2018.

(51) Int. Cl.
*H03F 3/45* (2006.01)
*H03G 3/30* (2006.01)

(52) U.S. Cl.
CPC ....... *H03G 3/3042* (2013.01); *H03F 3/45273* (2013.01); *H03F 3/45744* (2013.01); *H03G 3/3089* (2013.01); *H03F 2203/45022* (2013.01); *H03G 2201/708* (2013.01)

(58) Field of Classification Search
CPC .......... H03F 3/04; H03F 3/45; H03F 3/45179
USPC ................................. 330/253, 261
See application file for complete search history.

(56) References Cited

U.S. PATENT DOCUMENTS

| 3,636,463 | A | 1/1972 | Ongkiehong |
| 3,824,494 | A | 7/1974 | Wilcox |
| 3,939,468 | A | 2/1976 | Mastin |
| 4,276,543 | A | 6/1981 | Miller et al. |

(Continued)

FOREIGN PATENT DOCUMENTS

| EP | 0425064 A2 | 5/1991 |
| WO | 2018052657 A1 | 3/2018 |
| WO | 2019241081 A1 | 12/2019 |

OTHER PUBLICATIONS

Anadigm, "Using the Anadigm Multiplier CAM", Design Brief 208, www.anadigm.com, Copyright 2002, 2002, (6 pages).

(Continued)

*Primary Examiner* — Steven J Mottola
(74) *Attorney, Agent, or Firm* — Invention Mine LLC

(57) ABSTRACT

Methods and systems are described that include a differential amplifier driving an active load circuit, the active load circuit having a pair of load transistors and a high-frequency gain stage providing high frequency peaking for the active load circuit according to a frequency response characteristic determined in part by resistive values of a pair of active resistors connected, respectively, to gates of the pair of load transistors, and a bias circuit configured to stabilize the high frequency peaking of the high-frequency gain stage by generating a process-and-temperature variation (PVT)-dependent control voltage at gates of the active resistors to stabilize the resistive values of the pair of active resistors to account for PVT-dependent voltages at the gates of the pair of load transistors.

18 Claims, 11 Drawing Sheets

(56) References Cited

U.S. PATENT DOCUMENTS

| | | | |
|---|---|---|---|
| 4,774,498 A | 9/1988 | Traa |
| 4,897,657 A | 1/1990 | Brubaker |
| 5,017,924 A | 5/1991 | Guiberteau et al. |
| 5,459,465 A | 10/1995 | Kagey |
| 5,510,736 A | 4/1996 | Van |
| 5,748,948 A | 5/1998 | Yu et al. |
| 5,777,568 A | 7/1998 | Inoue |
| 5,793,254 A | 8/1998 | OConnor |
| 5,945,935 A | 8/1999 | Kusumoto et al. |
| 6,094,075 A | 7/2000 | Garrett et al. |
| 6,226,330 B1 | 5/2001 | Mansur |
| 6,232,908 B1 | 5/2001 | Nakaigawa |
| 6,346,907 B1 | 2/2002 | Dacy et al. |
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,546,063 B1 | 4/2003 | Lee et al. |
| 6,563,382 B1 | 5/2003 | Yang |
| 6,624,699 B2 | 9/2003 | Yin et al. |
| 6,839,587 B2 | 1/2005 | Yonce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,285,977 B2 | 10/2007 | Kim |
| 7,372,295 B1 | 5/2008 | Wei |
| 7,372,390 B2 | 5/2008 | Yamada |
| 7,397,302 B2 | 7/2008 | Bardsley et al. |
| 7,528,758 B2 | 5/2009 | Ishii |
| 7,560,957 B2 | 7/2009 | Chen et al. |
| 7,635,990 B1 | 12/2009 | Ren et al. |
| 7,656,321 B2 | 2/2010 | Wang |
| 7,683,720 B1 | 3/2010 | Yehui et al. |
| 7,688,102 B2 | 3/2010 | Bae et al. |
| 7,688,887 B2 | 3/2010 | Gupta et al. |
| 7,697,915 B2 | 4/2010 | Behzad et al. |
| 7,804,361 B2 | 9/2010 | Lim et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,537,886 B1 | 9/2013 | Shumarayev et al. |
| 8,547,272 B2 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,704,583 B2 | 4/2014 | Bulzacchelli et al. |
| 8,791,735 B1 | 7/2014 | Shibasaki |
| 8,841,936 B2 | 9/2014 | Nakamura |
| 8,860,590 B2 | 10/2014 | Yamagata et al. |
| 8,861,583 B2 | 10/2014 | Liu |
| 9,069,995 B1 | 6/2015 | Cronie |
| 9,106,462 B1 | 8/2015 | Aziz et al. |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,292,716 B2 | 3/2016 | Winoto et al. |
| 9,300,503 B1 | 3/2016 | Holden et al. |
| 9,705,708 B1 | 7/2017 | Jin et al. |
| 9,755,599 B2 * | 9/2017 | Yuan ............... H03F 3/193 |
| 10,003,315 B2 | 6/2018 | Tajalli |
| 10,326,623 B1 | 6/2019 | Tajalli |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1 | 7/2003 | Hsieh |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0008099 A1 | 1/2005 | Brown |
| 2005/0057379 A1 | 3/2005 | Jansson |
| 2005/0218980 A1 | 10/2005 | Kalb |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0097579 A1 | 5/2007 | Amamiya |
| 2007/0104299 A1 | 5/2007 | Cahn et al. |
| 2007/0159247 A1 * | 7/2007 | Lee ............... H03F 3/45475 330/253 |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2007/0285156 A1 | 12/2007 | Roberts et al. |
| 2008/0001626 A1 | 1/2008 | Bae et al. |
| 2008/0107209 A1 | 5/2008 | Cheng et al. |
| 2008/0165841 A1 | 7/2008 | Wall et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0146719 A1 | 6/2009 | Pernia et al. |
| 2009/0323864 A1 | 12/2009 | Tired |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0133816 A1 | 6/2011 | Wu et al. |
| 2011/0156819 A1 | 6/2011 | Kim et al. |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2012/0249217 A1 | 10/2012 | Fukuda et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0197747 A1 | 7/2016 | Ulrich et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2017/0302237 A1 | 10/2017 | Akter et al. |
| 2017/0309346 A1 | 10/2017 | Tajalli et al. |

(56) References Cited

U.S. PATENT DOCUMENTS

| | | |
|---|---|---|
| 2018/0076985 A1 | 3/2018 | Schell |
| 2019/0199557 A1 | 6/2019 | Taylor et al. |
| 2019/0221153 A1 | 7/2019 | Tsuchi et al. |
| 2019/0379563 A1 | 12/2019 | Tajalli et al. |
| 2020/0321778 A1 | 10/2020 | Gharibdoust et al. |
| 2021/0248103 A1 | 8/2021 | Khashaba et al. |

OTHER PUBLICATIONS

Schneider, J., et al., "ELEC301 Project: Building an Analog Computer", http://www.clear.rice.edu/elec301/Projects99/anlgcomp/, Dec. 19, 1999, (9 pages).

Tierney, J., "A Digital Frequency Synthesizer", Audio and Electroacoustics, IEEE Transactions, pp. 48-57, vol. 19, No. 1, Abstract, Mar. 1971, (1 page).

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

Second International Written Opinion for PCT/US2019/050440, dated Sep. 14, 2020, 1-12 (12 pages).

Dickson, Timothy, et al., "A 1.8 pJ/bit 16×16 Gb/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Kim, Kyu-Young, et al., "8 mW 1 65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

International Search Report and Written Opinion for PCT/US2019/050440, dated Dec. 16, 2019, 1-16 (16 pages).

Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

\* cited by examiner

PROGRAMMABLE CONTINUOUS TIME LINEAR EQUALIZER HAVING STABILIZED HIGH-FREQUENCY PEAKING FOR CONTROLLING OPERATING CURRENT OF A SLICER

CROSS REFERENCE TO RELATED APPLICATIONS

This application claims the benefit of U.S. Provisional Application No. 62/729,404, filed Sep. 10, 2018, naming Armin Tajalli, entitled "Programmable Continuous Time Linear Equalizer for Controlling Operating Current of a Slicer", which is hereby incorporated herein by reference in its entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/542,599, filed Jul. 5, 2012, now U.S. Pat. No. 8,593,305, granted Nov. 26, 2013, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, now U.S. Pat. No. 9,300,503, granted Mar. 29, 2016, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. patent application Ser. No. 14/636,098, filed Mar. 2, 2015, now U.S. Pat. No. 9,363,114, granted Jun. 7, 2016, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, now U.S. Pat. No. 9,100,232, granted Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, now U.S. Pat. No. 9,288,082, granted Mar. 15, 2016, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, now U.S. Pat. No. 9,461,862, granted Oct. 4, 2016, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, now U.S. Pat. No. 9,577,815, granted Feb. 21, 2017, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, now U.S. Pat. No. 9,557,760, granted Jan. 31, 2017, naming Armin Tajalli, entitled "Advanced Phase Interpolator", hereinafter identified as [Tajalli II].

U.S. patent application Ser. No. 15/415,831, filed Jan. 25, 2017, now U.S. Pat. No. 10,003,135, granted Jun. 19, 2018, naming Armin Tajalli, entitled "Voltage Sampler Driver with Enhanced High-Frequency Gain", hereinafter identified as [Tajalli III].

U.S. patent application Ser. No. 16/435,412, filed Jun. 7, 2019, now U.S. Pat. No. 10,742,451, granted Aug. 11, 2020, naming Armin Tajalli, entitled "Passive Multi-Input Comparator for Orthogonal Codes on a Multi-Wire Bus", hereinafter identified as [Tajalli IV].

FIELD OF THE INVENTION

The present embodiments relate to communications systems circuits generally, and more particularly to obtaining an instantaneous measurement of a received signal voltage relative to a provided clock signal, as one component of detecting received communications signals from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device is sampled (or their signal value otherwise recorded) at intervals best representing the original transmitted values, regardless of transmission channel delays, interference, and noise. The timing of this sampling or slicing operation is controlled by an associated Clock and Data Recovery (CDR) timing system, which determines the appropriate sample timing.

BRIEF DESCRIPTION

To reliably detect the data values transmitted over a communications system, a receiver accurately measures the received signal value amplitudes at carefully selected times. In some embodiments, the value of the received signal is first captured at the selected time using a known sample-and-hold or track-and-hold circuit (or known variants such as amplify-and-hold or integrate-and-hold), and then the resulting value is measured against one or more reference values using a known voltage comparator circuit. Other embodiments first use a comparator to "slice" the analog signal and obtain a digital result, then digitally sample the resulting binary value using a clocked digital latch. Further embodiments utilize circuits configured to apply both the time- and amplitude-domain constraints, producing a result that represents the input value at a particular time and relative to a provided reference level.

Prior to signal sampling, input amplification, often in the form of a Continuous Time Linear Equalizer (CTLE) may be used to compensate for transmission signal losses and provide sufficient signal amplitude for reliable detection. Systems utilizing Orthogonal Differential Vector Signaling (ODVS) as described in [Cronie I] may additionally combine multiple input signals to recover an encoded data stream using a weighted linear summation element, commonly known as a "multi-input comparator" or MIC.

In many embodiments, a received signal source may be measured by multiple sampling circuits, either to facilitate data reception at rates greater than a single data processing system can sustain (so-called multiphase receiver architectures), or to support ancillary functions such as clock synchronization, test/diagnostic support, etc. In these embodiments, energy leakage such as from clock switching within one sampler may appear as transients at the sampler input (herein described as "kickback"), which may then perturb other sampler measurements of the common input signal. These perturbations are magnified where each receive signal source must drive multiple samplers, examples including multi-phase receiver embodiments, systems utilizing loop-unrolled or speculative Decision Feedback Equalization (DFE), or auxiliary services such as Clock Data Recovery (CDR) or a diagnostic eye-scope. Linear processing circuits having relatively weak output drive capability are particularly susceptible to such perturbations, especially in systems attempting to minimize overall power consumption. Sampler embodiments are described which produce extremely low levels of kickback energy, making them particularly desirable in such applications, along with CTLE and MIC driver embodiments optimized for use with such samplers.

Methods and systems are described for receiving a signal to be sampled and responsively generating, at a pair of common nodes, a differential current representative of the received signal, receiving a plurality of sampling interval signals, each sampling interval signal received at a corresponding sampling phase of a plurality of sampling phases, for each sampling phase, pre-charging a corresponding pair of output nodes using a pre-charging field-effect transistor (FET) pair receiving the sampling interval signal, forming a differential output voltage by discharging the corresponding pair of output nodes via a discharging FET pair connected to the pair of common nodes, the FET pair receiving the sampling interval signal and selectively enabling the differential current to discharge the corresponding pair of output nodes, and latching the differential output voltage.

DETAILED DESCRIPTION

Figure 1:
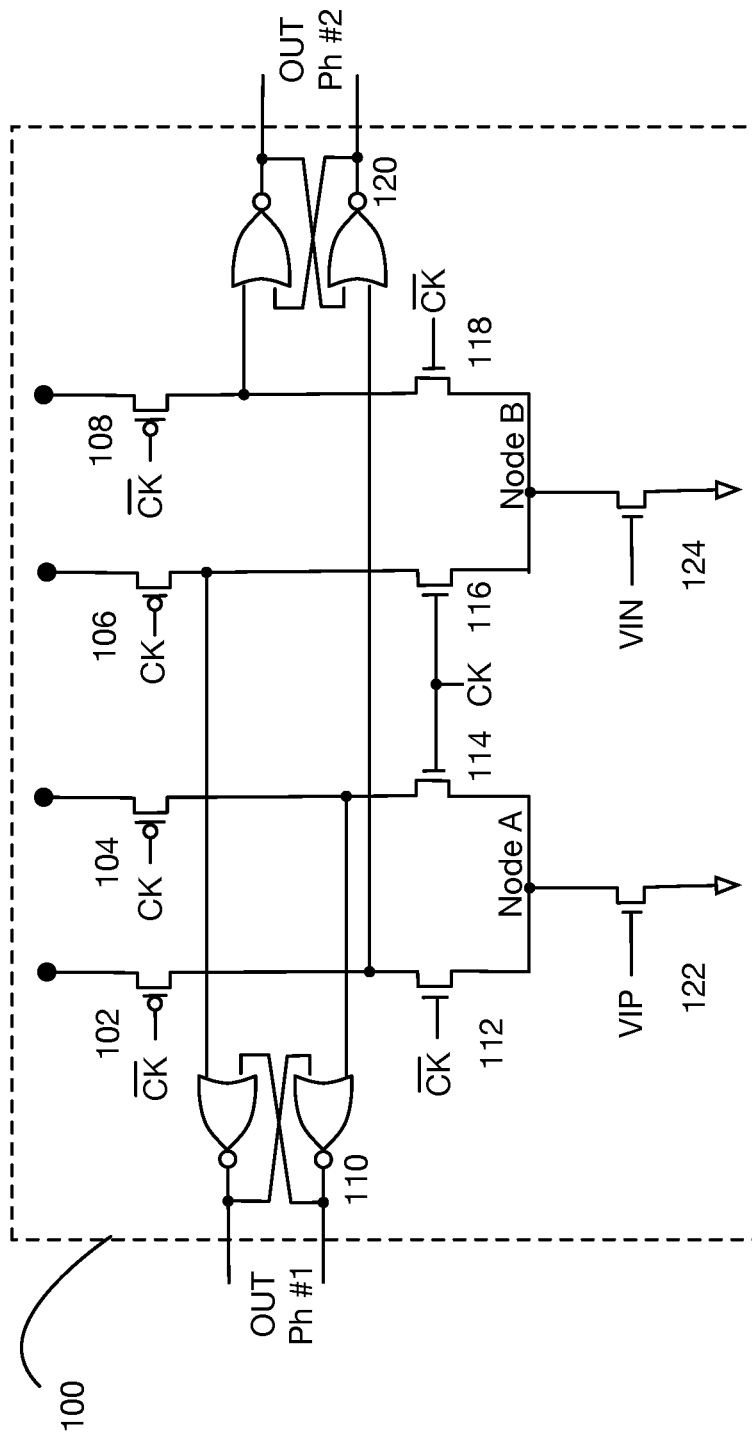
FIG. 1 is a schematic diagram of a clocked voltage sampler embodiment.

To reliably detect the data values transmitted over a communications system, a communications receiver accurately measures its received signal value amplitudes at carefully selected times, typically at or near the center of that received signal's period of stability between transitions. This point is commonly described as the "center of eye", (referring to the well-known "eye diagram" of signal amplitude vs. clock intervals) and is typically determined by use of a local "receive clock" which is configured to occur at that desirable sampling time. Generation and ongoing control of such receive clock timing is well understood in the art, as Clock Data Alignment (CDA) systems measure and incrementally adjust sample timing versus receive signal stability time to optimize sample timing.

In some embodiments, the value of the received signal is first captured at the selected time using a sample-and-hold or track-and-hold circuit, and then the resulting value is measured against one or more reference values using a known voltage comparator circuit. In alternative embodiments, the signal amplitude is continuously measured using a voltage comparator, with the digital result then sampled in time using a clocked digital latch.

Other embodiments utilize circuits capable of applying both the time- and amplitude-domain constraints, producing a result that represents the input value at a particular time and relative to a provided reference level.

In particular, vector signaling codes of the type described in [Cronie I], [Cronie II], and [Shokrollahi II] may be efficiently decoded using so-called Multi-Input Comparators (MICs) as described in [Holden I] and [Tajalli I]. In one embodiment, each MIC performs an analog computation of the form $$\text{sign}(a_0 * x_0 + \ldots + a_{m-1} * x_{m-1}),  \quad \text{Eqn. 1}$$

where $(x_0, x_1, \ldots, x_{m-1})$ are the received vector signaling code values, and $a_0, a_1, \ldots, a_{m-1}$ are "weighting factors" associated with each input, and the sign function is defined as:

sign(x)=+1 if x>0, sign(x)=−1 if x<0, and sign(x) is undefined if x=0.

[Holden I] also teaches that Eqn. 1 may be efficiently embodied in a differential amplifier structure having multiple positive and multiple negative inputs, each such input structure representing one element of Eqn. 1. [Ulrich I] further teaches that the weighting factors in such input structures may be efficiently represented as scaled transistor dimensions in an integrated circuit embodiment, or alternatively as paralleled multiple transistor instances where the set of weighting factors may be represented as integer values.

In vector signaling code receivers, each subchannel is composed of a MIC performing the mixing or weighted summation operations for decoding a subchannel, sampling of the resulting output, followed by implementation-specific data processing. At high data rates, four or more phases of data processing may be implemented to keep up with the received symbol rate of the decoders, with each phase typically utilizing its own sampler.

Thus, a single received signal source may be measured by multiple sampling circuits, either to facilitate data reception at rates greater than a single data processing system can sustain, or to support ancillary functions such as clock synchronization, test/diagnostic support, etc. In these embodiments, energy leakage such as from clock switching within one sampler may appear as transients at the sampler input (herein described as "kickback"), which may then perturb other sampler measurements of the common input signal. Sampler embodiments are described that produce extremely low levels of kickback energy, making them particularly desirable in such applications.

Low Kickback Sampler

In many embodiments, a received signal source may be measured by multiple sampling circuits, either to facilitate data reception at rates greater than a single data processing system can sustain (so-called multiphase receiver architectures), or to support ancillary functions such as clock synchronization, test/diagnostic support, etc. In such embodiments, energy leakage such as from clock switching within one sampler may appear as transients at the sampler input (herein described as "kickback"), which may then perturb other sampler measurements of the common input signal. Sampler embodiments are described below that produce extremely low levels of kickback energy, making them particularly desirable in such applications.

FIG. 1 is a schematic diagram for a clocked sampler embodiment presenting extremely low kickback energy to its inputs. When CK is low, the center two discharging field-effect transistors (FETs) 114, 116 are off, and the two pre-charging PMOS FETs 104, 106 are turned on to charge the parasitic capacitance of 114 and 116 at the output nodes (drain terminals). With both of the output nodes charged, the inputs to the OR-gate latch 110 are both high voltages representing logic 1's, thereby causing both outputs of OUT Ph #1 to be lower voltage logic 0's. VIP (Vin+) and VIN (Vin−) are applied to tail current sources 122 124, respectively. Once CK goes high, the PMOS pre-charging FETs 104, 106 are turned off and the NMOS discharging FETs 114 116 are turned on. Depending on the polarity of Vin, VIP will be high or VIN will be high. Whichever one is high will cause either FET 122 or FET 124 to conduct current thereby discharging the respective output node of either FET 114 (if VIP is high) or FET 116 (if VIN is high). As the respective output node transitions to a logic 0, the corresponding NOR gate of latch 110 will transition to a logic 1. As an example, if VIP is high, FET 122 conducts current and discharges the drain output node of discharging FET 114, causing both inputs to the bottom NOR gate of latch 110 to be 0, causing its output to toggle to a 1, which also locks the top NOR gate of latch 110 to have a logic 0 output. Similarly, the FETs 112, 118, 102, 108 operate in the same way with latch 120, but with the timing associated with clock phase $\overline{CK}$. Further, the PMOS/NMOS configurations described above should not be considered limiting, and may be reversed in some embodiments.

Sampler 100 is inherently two-phased, controlled by complementary clocks CK and (CK)⁻, sampling differential signal inputs VIP and VIN and producing digital results OUTPh #1 and OUTPh #2. The circuit symmetry causes potential clock-related noise injection to be cancelled out, or to appear as less troublesome common-mode input disturbances. Because Node A and Node B are at virtual ground level and thus experience little voltage swing, they are relatively immune to noise induced via parasitic paths from the sampler output or clock inputs. As Nodes A and B experience a small amount of voltage swing due to the isolation from the output nodes, the amount of input kickback that is introduced into input signals VIP and VIN is reduced. Further, the Miller capacitance of the transistors associated with VIP and VIN inputs is extremely low and constant, further reducing input kickback.

One of inputs VIP and VIN may alternatively be used as a reference voltage input and the other as a single-ended received signal input.

Figure 5:
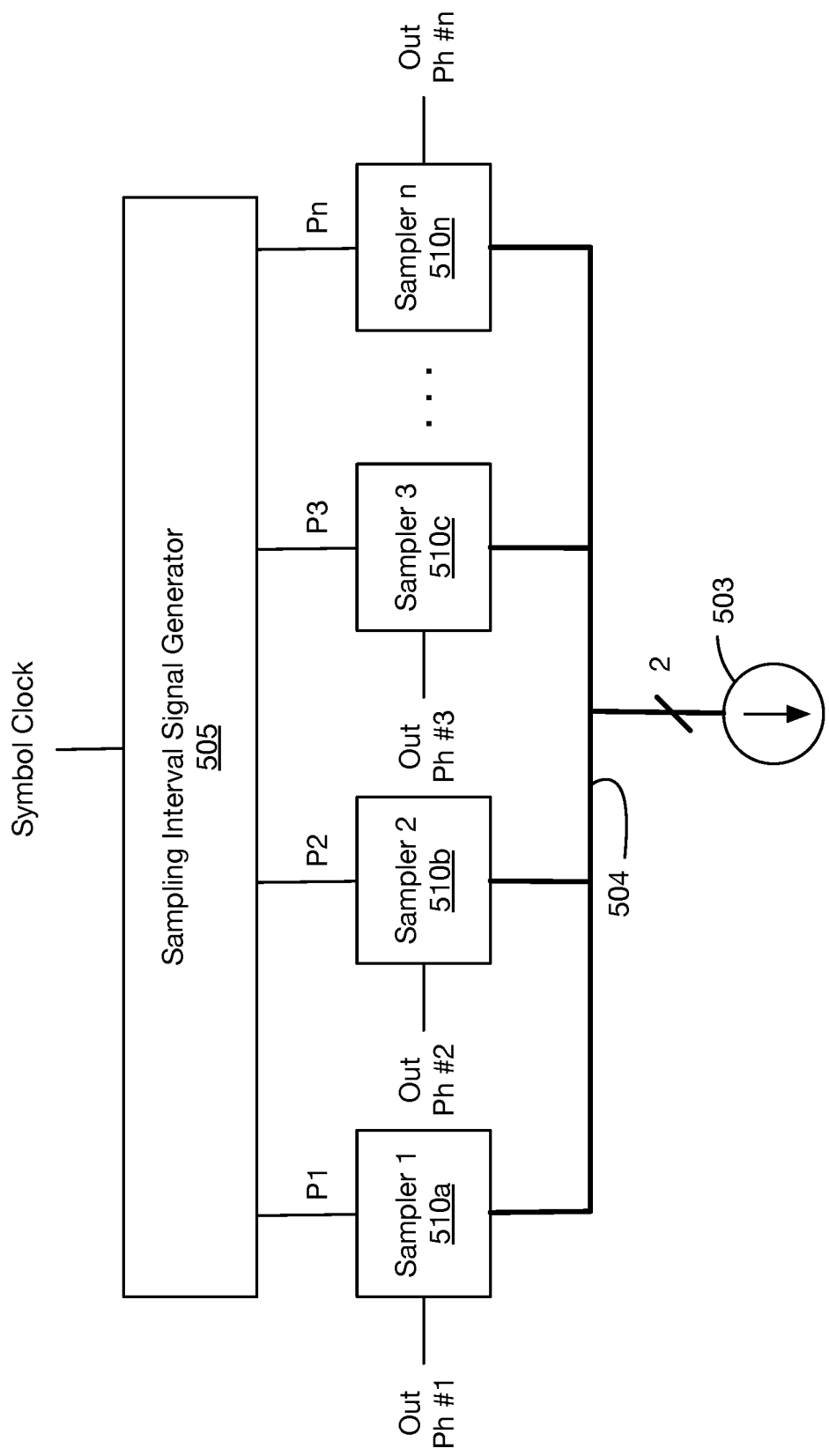
FIG. 5 is a block diagram of a multi-phase sampler with low input kickback, in accordance with some embodiments.

FIG. 5 illustrates a multi-phase sampler with low input kickback, in accordance with some embodiments. As shown, the multi-phase sampler includes a differential current generator 503 configured to receive a signal to be sampled, and to responsively generate, at a pair of common nodes 504, a differential current representative of the received signal. The apparatus further includes a sampling interval signal generator 505 configured to receive a symbol clock and to responsively generate the sampling interval signals P1, P2, . . . Pn on a plurality of sampling interval phase outputs. The apparatus further includes a plurality of samplers 510a/510b/ . . . /510n, each sampler connected to the pair of common nodes 504. In some embodiments, each sampler includes a pre-charging FET pair having a control input connected to one of the plurality of sampling interval phase outputs to pre-charge a pair of output nodes. Further, each sampler may include a FET pair, each FET of the FET pair connected to a corresponding common node of the pair of common nodes, the FET pair having a control input connected to one of the plurality of sampling interval phase outputs and configured to selectively enable the differential current to discharge the pair of output nodes, forming a differential output voltage. The sampler further includes a latch connected to the output nodes of the FET pair, the latch configured to latch the differential output voltage to form outputs Out Ph #1, etc.

Referring to the example given in FIG. 1, it may be observed the schematic of FIG. 1 includes 2 samplers. The first sampler includes pre-charging FET pair 104/106 connected to sampling interval signal CK, and includes discharging FET pair 114/116 connected to sampling interval signal CK to discharge the output nodes connected to latch 110 using differential current generator composed of current sources 122 and 124 receiving the signal to be sampled VIN/VIP. Similarly, FIG. 1 includes a second sampler receiving sampling interval signal CK, the second sampler composed of pre-charging FET pair 102/108, FET pair 112/118, and latch 120.

Figure 4:
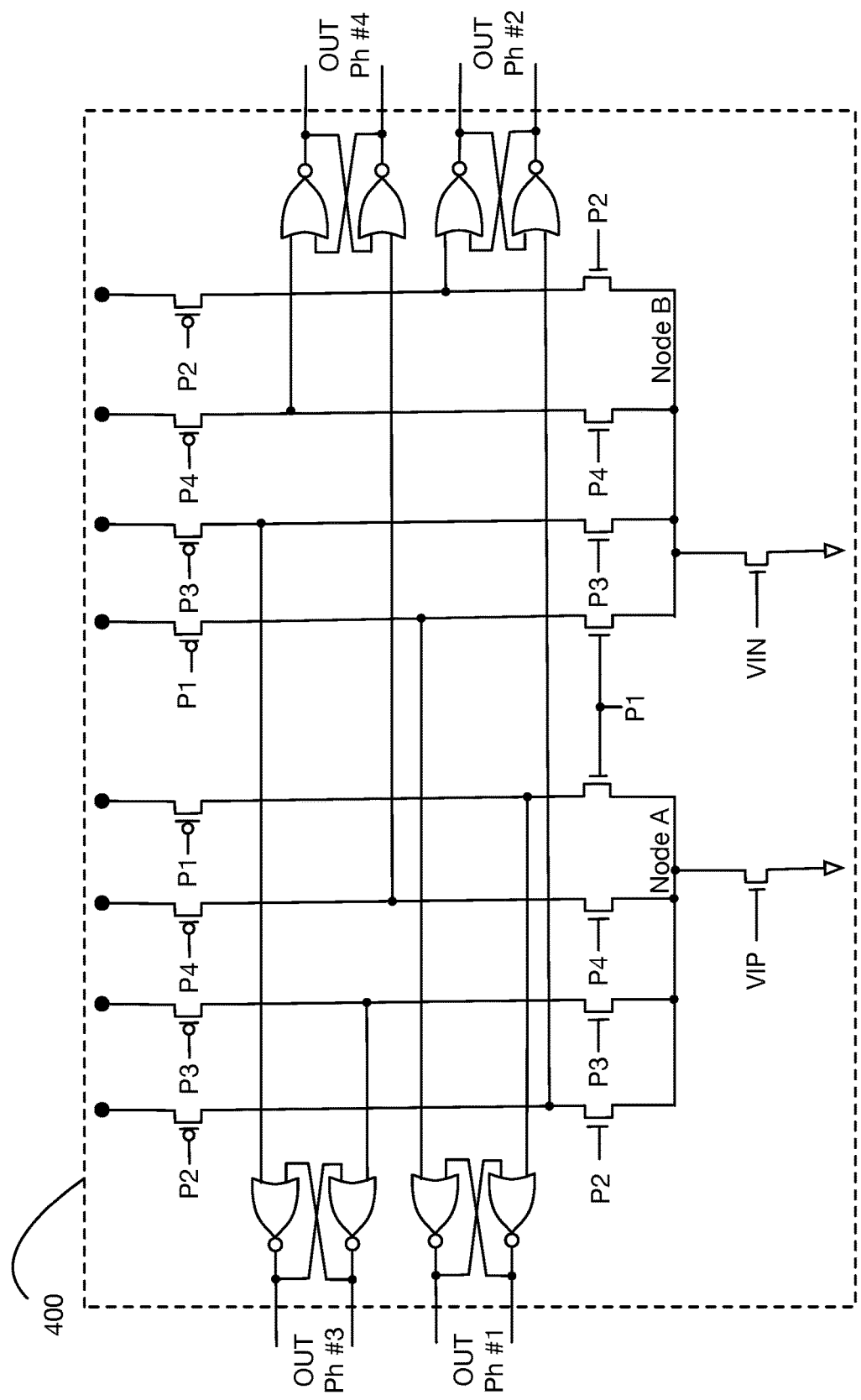
FIG. 4 is a schematic diagram of another clocked voltage sampler embodiment.

The described architecture may be extended to support additional sampling phases within the same sampling circuit. FIG. 4 is a schematic diagram of another embodiment, in which the two phase transistor elements of 100 connecting to Node A and Node B in FIG. 1 are replicated. In the resulting four phase clocked sampler embodiment 400, clock phases P1, P2, P3, and P4 are four non-overlapping clock phases, each controlling the sample timing for respective differential outputs OUT Ph #1, OUT Ph #2, OUT Ph #3, OUT Ph #4. Other numbers of sampling phases may be supported by similarly replicating the appropriate number of transistor structures as illustrated by these examples.

Figure 6A:
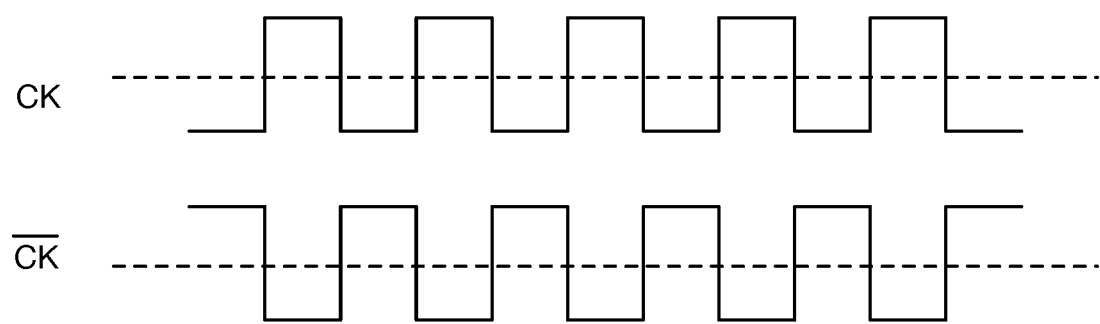
FIGS. 6A and 6B are timing diagrams depicting sampling interval signals, in accordance with some embodiments.
Figure 6B:
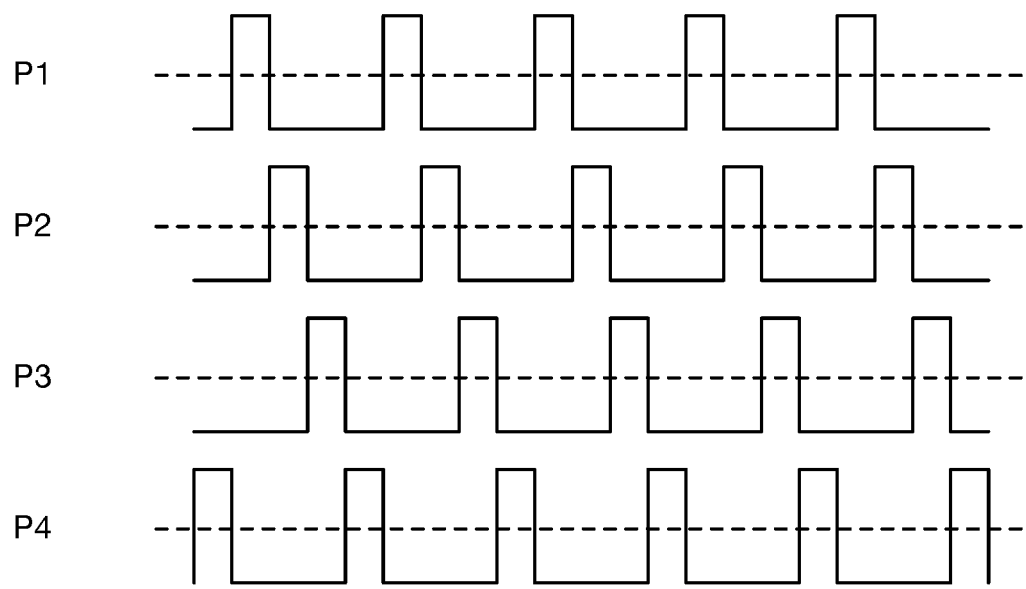

FIGS. 6A and 6B illustrate timing diagrams for sampling interval signals, in accordance with some embodiments. As shown, FIG. 6A illustrates sampling interval signals CK and $\overline{CK}$, in accordance with FIG. 1. As shown, sampling interval signals CK and $\overline{CK}$ are clock signals having a 50% duty cycle and a 180-degree phase difference, and are non-overlapping. FIG. 6B illustrates a set of four sampling interval signals P1/P2/P3/P4 in accordance with FIG. 4. As shown, each sampling interval signal P1/P2/P3/P4 has a duty cycle of 25% and are thus non overlapping. In some embodiments, for a given number of phases n, a duty cycle of each sampling interval may be 1/n·100%. In some embodiments, the sampling interval signal generator may operate on a received symbol clock, which may be received on separate wires of the multi-wire bus, embedded in a sub-channel in orthogonal encoding embodiments, derived from signal transitions on the multi-wire bus, or various other ways of clock data recovery (CDR). In some embodiments, the symbol clock may be used directly, as in FIG. 6A, while alternative embodiments may generate non-overlapping signals such as the sampling interval signals P1/P2/P3/P4 in FIG. 6B.

Figure 7:
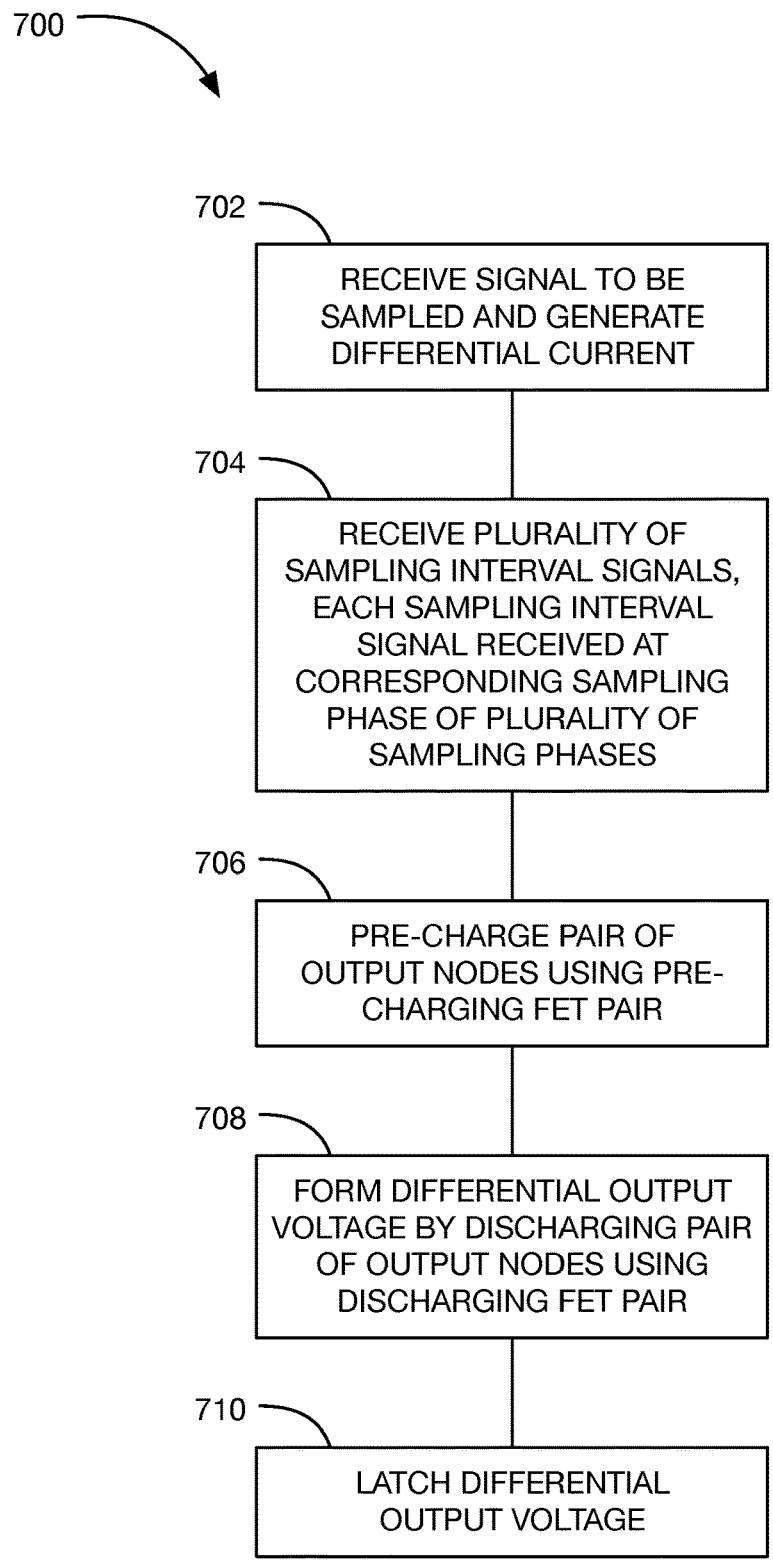
FIG. 7 is a flowchart of a method, in accordance with some embodiments.

FIG. 7 depicts a flowchart of a method 700, in accordance with some embodiments. As shown, method 700 begins at step 702 by receiving a signal to be sampled and responsively generating, at a pair of common nodes, a differential current representative of the received signal. Further, a plurality of sampling interval signals is received 704, each sampling interval signal received at a corresponding sampling phase of a plurality of sampling phases. For example, as shown in FIG. 1, the sampling phase OUT Ph #1 receives sampling interval signal CK, while sampling phase OUT Ph #2 receives sampling interval signal CK. For each sampling phase, a corresponding pair of output nodes are pre-charged 706 using a pre-charging FET pair receiving the sampling interval signal. In FIG. 1, a pre-charging FET pair may include FETs 104 and 106. A differential output voltage is formed 708 by discharging the corresponding pair of output nodes via a discharging FET pair, such as FET pair 114/116 connected to the pair of common nodes, the FET pair receiving the sampling interval signal and selectively enabling the differential current to discharge the corresponding pair of output nodes. Lastly, the differential output voltage is latched 710, for instance using SR latch 110.

Figure 3A:
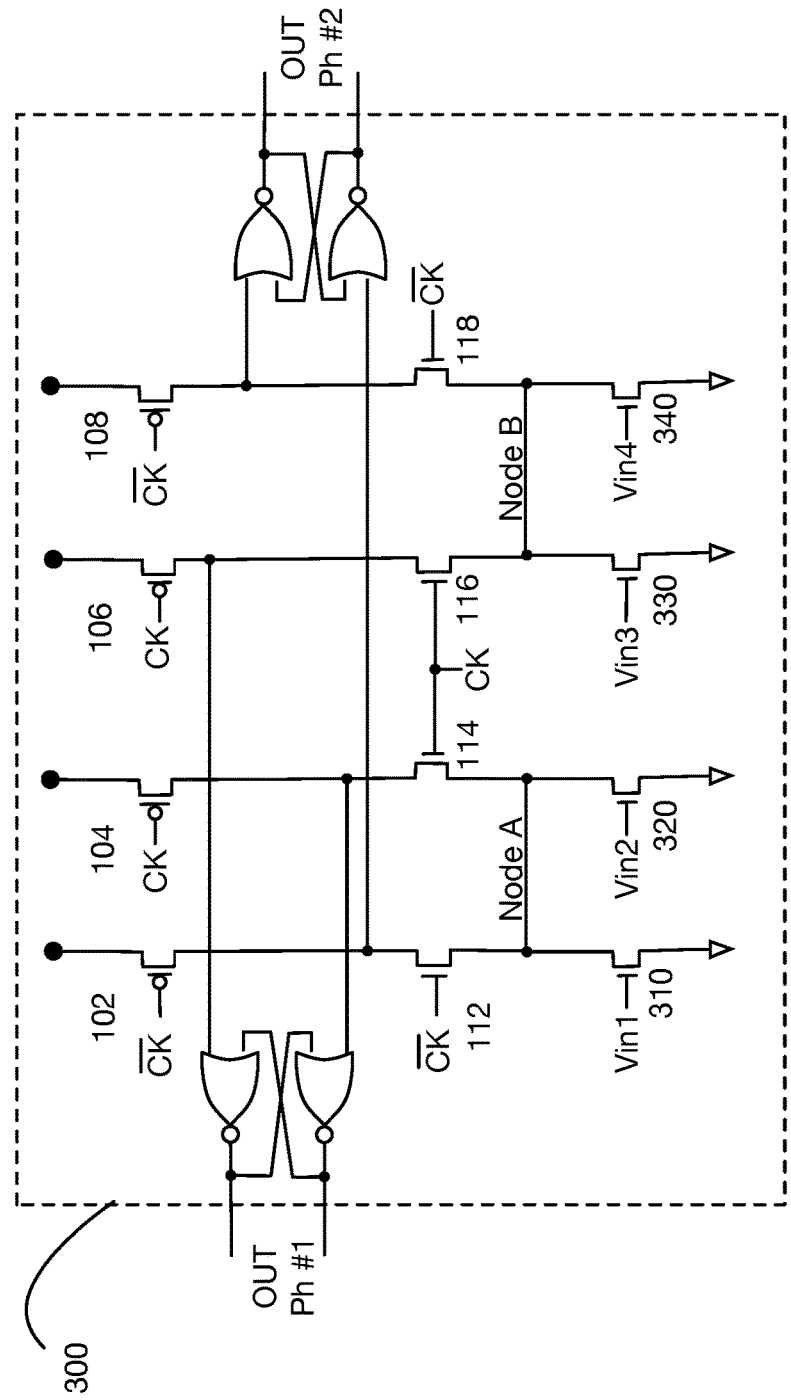
FIGS. 3A, 3B, and 3C are schematic diagrams of a clocked voltage sampler embodiment further comprising linear decoding of a vector signaling code, in accordance with some embodiments.
Figure 3B:
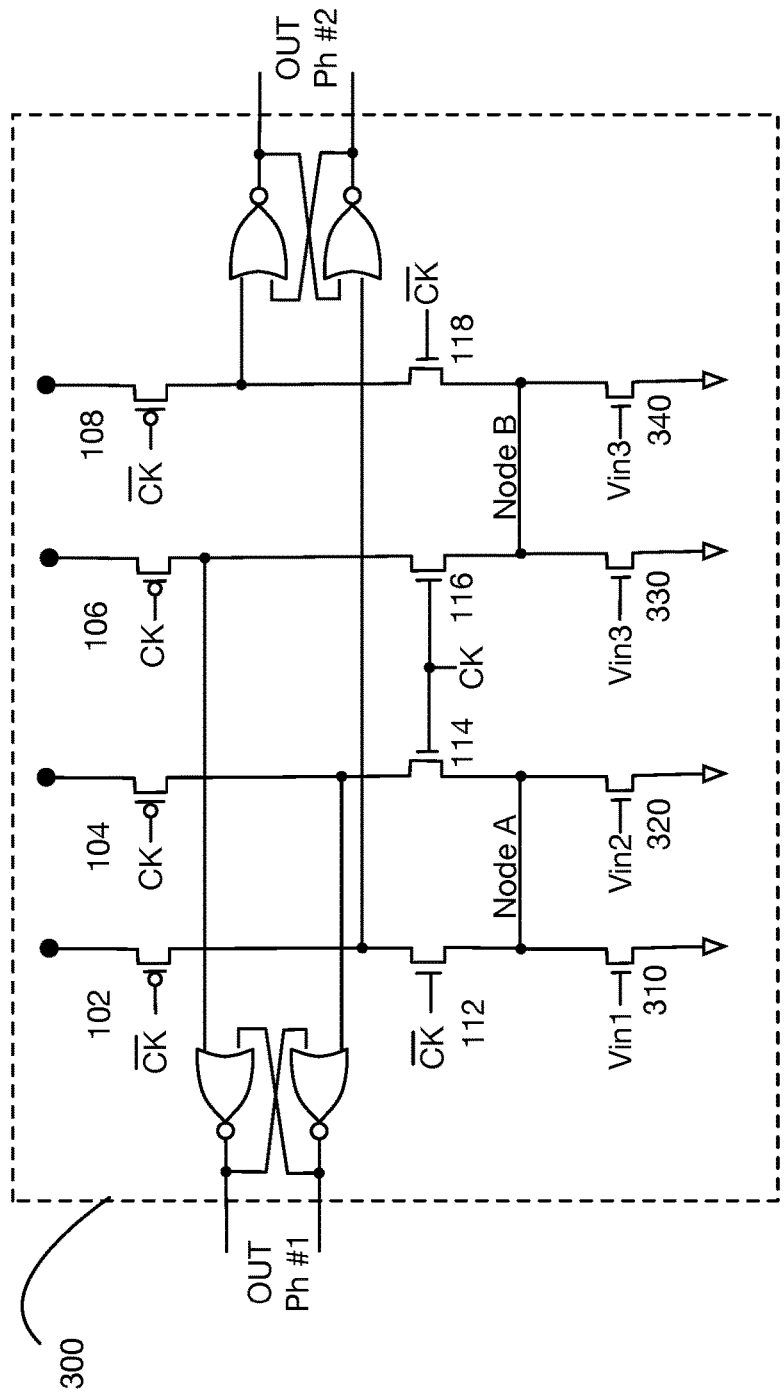
Figure 3C:
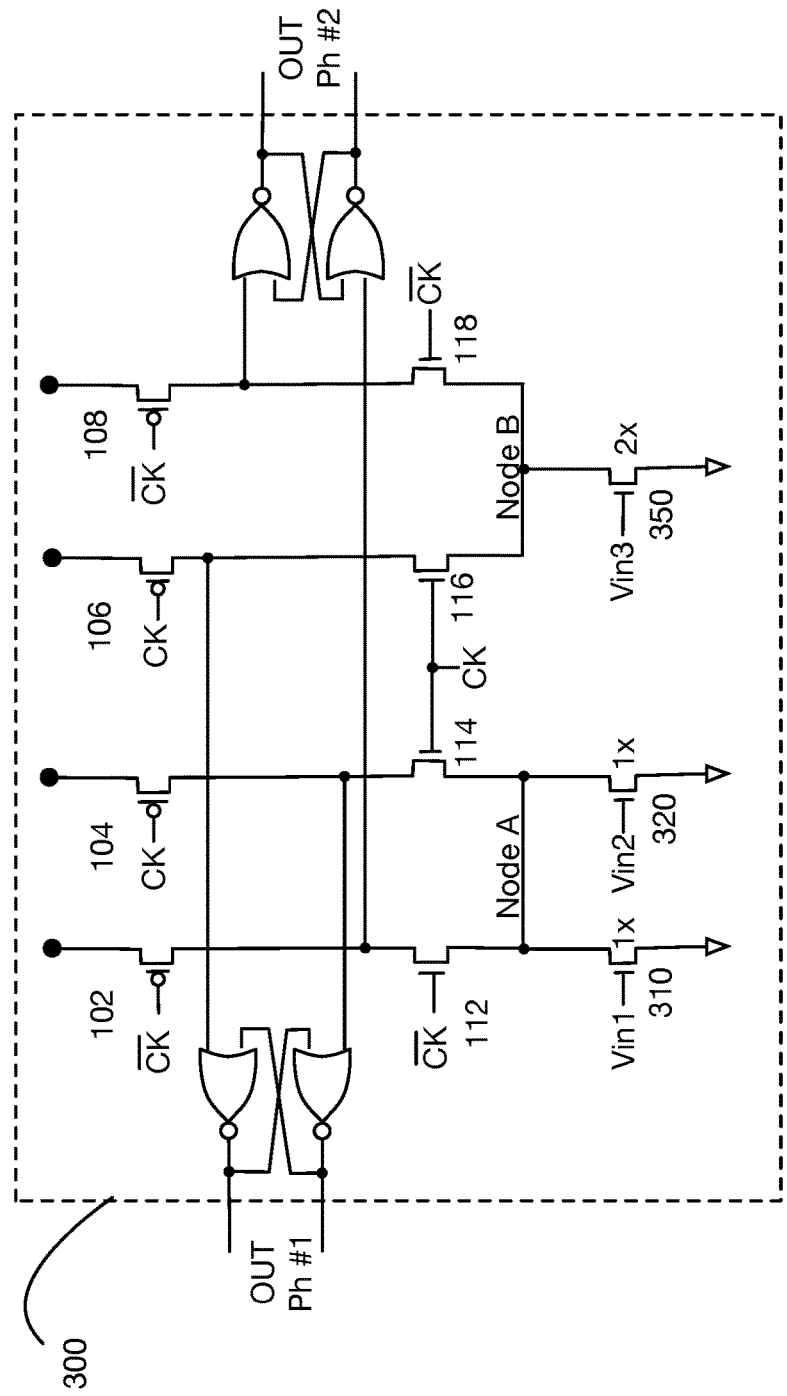

In some embodiments, the received signal to be sampled is a differential input signal, such as VIN/VIP shown in FIG. 1. Alternatively, the received signal to be sampled comprises a plurality of signal components corresponding to symbols of a codeword of a vector signaling code, such as signal components Vin1/Vin2/Vin3/Vin4 shown in FIG. 3A. In some embodiments, generating the differential current comprises forming linear combinations of the signal components of the received signal to be sampled. FIGS. 3A-3C illustrate such circuits for forming linear combinations. Specifically, FIG. 3A illustrates the linear combination of (Vin1+Vin2)−(Vin3+Vin4). In such embodiments, the linear combinations are formed using a plurality of current sources. In some embodiments, the plurality of current sources each have equal magnitude, as shown in FIG. 3A and FIG. 3B. Alternatively, a first current source of the plurality of current sources has a magnitude larger than a second current source of the plurality of current sources. Such an embodiment is illustrated by FIG. 3C, where current source depicted by 350 has a magnitude 2× that of current sources depicted by transistors 310 and 320, each having magnitude 1×.

In some embodiments, the pair of common nodes are virtual ground for isolating the received signal to be sampled from the pair of output nodes.

Figure 2:
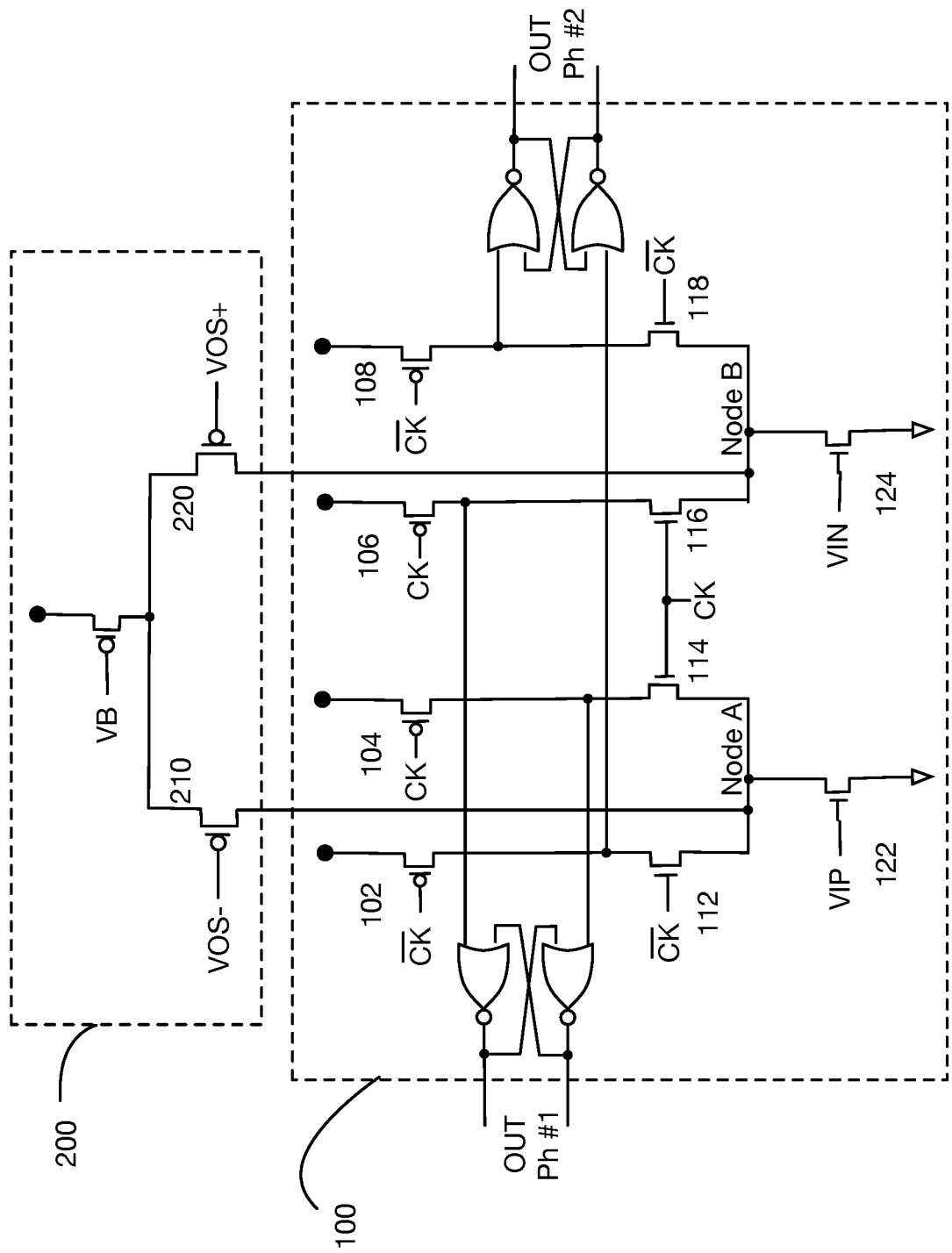
FIG. 2 is a schematic diagram of a clocked voltage sampler embodiment further comprising an offset voltage compensator.

In some embodiments, the method further includes injecting an offset voltage into the pair of common nodes, as shown for example in FIG. 2.

In some embodiments, the plurality of sampling interval signals are non-overlapping, as shown in FIGS. 6A and 6B.

Offset Voltage Compensation

FIG. 2 is a schematic diagram of an embodiment combining the clocked voltage sampler of FIG. 1 with an offset voltage compensation circuit. As shown, offset voltage compensation circuit takes the form of a differential offset FET pair 210/220. Sampler 100 is effectively identical to the circuit of FIG. 1, with offset voltage compensator 200 injecting corrective voltages VOS+ and VOS− into the pair of common nodes of 100 at Node A and Node B. Voltage VB provides bias current for the offset voltage compensator 200, and should be selected such that the PMOS side current does not exceed the NMOS side current within 200. VB also has a secondary control effect on sampler gain, with low PMOS current relative to NMOS current in 200 correlating with low gain in 100, and similar PMOS and NMOS currents in 200 correlating with higher gain in 100.

The use of a single offset voltage correction circuit 200 for a single sampler 100 providing results to two processing phases results in a lower power utilization for the overall sampler system, compared to known art methods requiring one correction circuit per sampler per processing phase.

The corrective voltages may be used to adjust circuit parameters, such as to compensate for circuit imbalance caused by component mismatch or drift. Alternatively, in at least one embodiment the corrective voltages comprise signal measurement thresholds intentionally introduced to control the switching point for sampler output results. In a further embodiment the corrective voltages comprise communications network compensation values, such as produced by a Decision Feedback Compensation (DFE) system.

Combined Linear Decoder and Sampler

The clocked voltage sampler of FIG. 1 may also be combined with the functionality of a Multi-input comparator (MIC) to produce a single circuit that mixes (i.e. decodes) a vector signaling code input and samples the decoded result. FIG. 3A is a schematic diagram of one such embodiment, in which multiple paralleled input transistors 310, 320, 330, 340 accepting signal components of the received signal to be sampled, shown as vector signaling code inputs Vin1, Vin2, Vin3, and Vin4 respectively. A linear combination of the signal components may be formed to form an output. As shown in FIG. 3A, the linear combination is represented by the equation (Vin1+Vin2)−(Vin3+Vin4). Further, additional paralleled transistors may be attached to Node A and/or Node B, either to support additional inputs, or to provide integer ratio weighting functions for particular inputs, as taught in [Holden I], [Ulrich I], and [Tajalli I]. FIG. 3B is a schematic diagram illustrating the use of transistors 330 and 340 both accepting Vin3 to apply a weight of 2 to Vin 3, while Vin1 and Vin2 each have weights of 1. As such, the linear combination performed by the circuit of FIG. 3B is (Vin1+Vin2)−(2·Vin3). In some embodiments, a sum of weights connected to each Node A and Node B is equal, representing a balanced condition. FIG. 3C illustrates a further embodiment utilizing weighting, in which transistors 330 and 340, each having weights of 1, are replaced by a single transistor 350 receiving Vin3 and having a weight of 2. In such embodiments, transistor 350 may have different characteristics than transistors 310 and 320 applying weights of 1 to Vin1 and Vin2, respectively. Such characteristics may include differing transistor width/length, for instance. Similar to FIG. 3B, the circuit depicted by FIG. 3C represents the linear combination of (Vin1+Vin2)−(2·Vin3). In some embodiments, 300 may be combined with 200 of FIG. 2 to inject offset voltage corrections into Node A and Node B, e.g. to support DFE correction.

Matched CTLE/Mixer and Sampler

Figure 8:
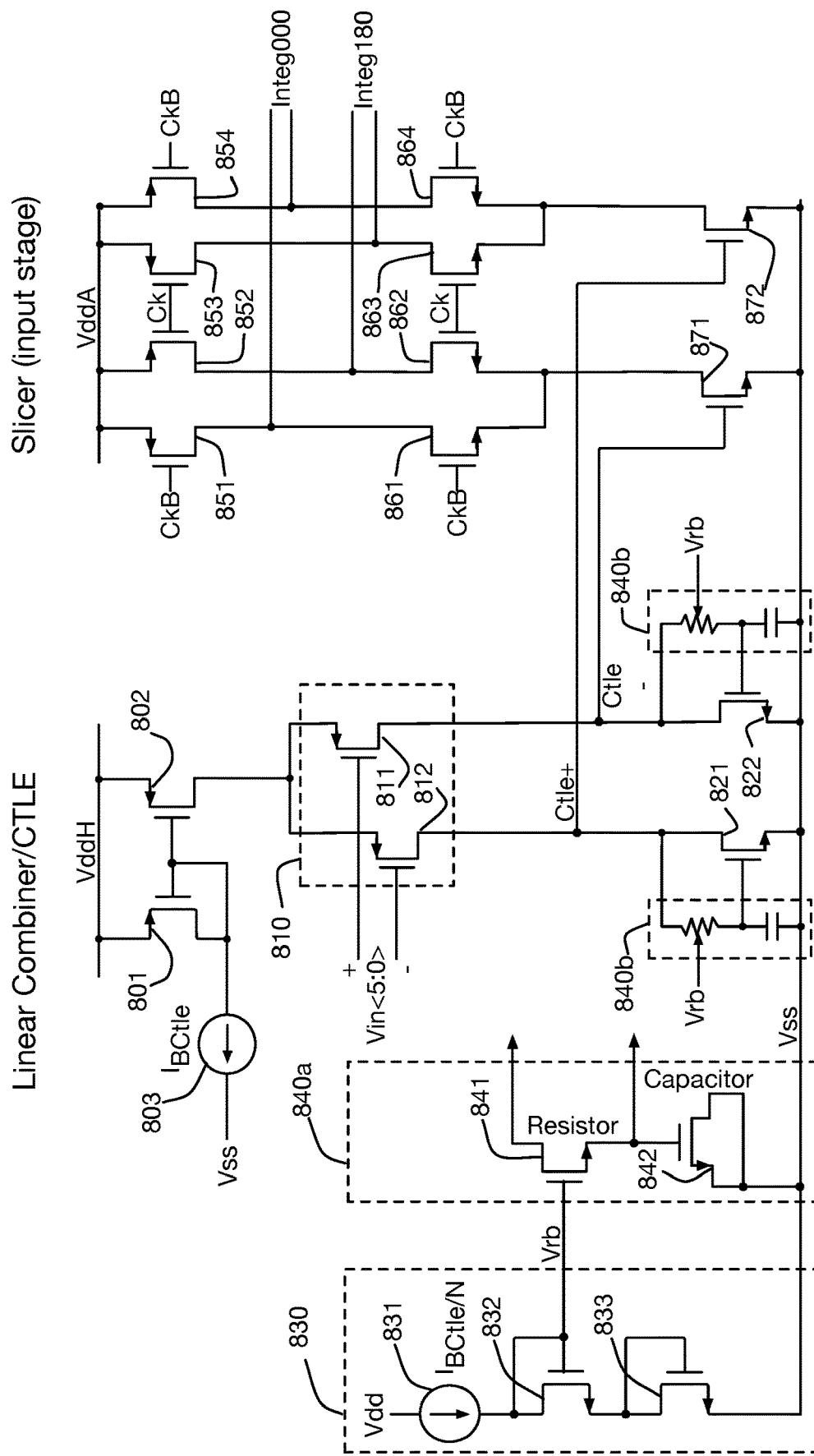
FIG. 8 is a schematic diagram of an input driver and sampler combination.

FIG. 8 shows a configurable CTLE circuit, optionally also providing MIC-like multiple input signal mixing, optimized to both efficiently drive and provide input bias to one or more sampler elements. A minimal embodiment incorporates a single differential transistor input pair with a pair of load transistors acting as an active load. In FIG. 8, the tail circuits for differential input pair 810 are current sinks shown as active load transistors 821 and 822, which additionally utilize Resistor/Capacitor networks 840b to provide a frequency-dependent gain or "gain peaking" function.

High frequency peaking for the active load circuit is determined in part by resistive values of a pair of active resistors 841 connected, respectively, to gates of the pair of load transistors 821 and 822, producing the desired CTLE frequency response characteristic. A bias circuit 803 sets the operating current for the differential amplifier shown as fixed bias current $I_{BCtle}$, with a second bias circuit 830 stabilizing the high frequency peaking of the high-frequency gain stage by generating a process-and-temperature variation (PVT)-dependent control voltage Vrb at gates of the active resistors 841 to maintain a constant Vgs over active resistor 841 relative to the PVT-dependent voltage at the source of active resistor 841, thus maintaining stable resistive values.

As has been previously described in detail by [Ulrich I] and [Shokrollahi II], ODVS detection may be performed by weighted mixing of input signals, as in a Multi-Input Comparator. In a further embodiment, this mixing is performed using multiple instances of differential amplifier 810, each instance accepting one of input signals Vin<5:0>, the outputs of the multiple differential pairs being connected essentially in parallel. The desired weighting function is provided by use of multiple instances of 810 per input signal, e.g. two instances for a weight of 2, one instance for a weight of one, zero instances for a weight of zero. Negative weights may be embodied by reversing the differential input signals applied to 811 and 812. Alternatively, the input signals Vin<5:0> may be partially combined using a passive MIC as described in [Tajalli IV]. The passive MICs as described in [Tajalli IV] utilize resistive networks to generate analog summations of the input signals, and to generate a differential signal as an output to be provided to differential amplifier 810, which may be subsequently sliced by the slicing circuit. Furthermore, additional slicing circuits having different thresholds (implemented via e.g., an offset differential pair connected in parallel to transistors 871 and 872 of the slicer in FIG. 8, not shown) may be incorporated to perform multi-level detection of differential inputs provided to differential amplifier 810 that have more than two possible values. One particular application of this is to detect pulse amplitude modulation (PAM) signals.

The operating current for the CTLE differential amplifier 810 is set by a current mirror composed of transistors 801 and 802, which mirrors the fixed bias reference current 803, here shown to be of value $I_{BCtle}$. The geometry and functional characteristics of bias transistors 801 and 802 should be identical to those of differential input transistors 811 and 812, reducing circuit operational variations over PVT.

As is well understood, the frequency-dependent small signal gain of a CTLE circuit is categorized into two or more frequency ranges or domains, with transitions between domains occurring at particular "break frequencies." For the circuit of FIG. 8, the small signal gain in a first, low-frequency domain is determined primarily by the ratio of transistor transconductance (Gm) between the input differential pair transistors 811/812, and the active load transistors 821/822. Similarly, the small signal gain in a second, high-frequency domain is determined primarily by the transconductance of input transistors 811/812 times the effective load impedance of active load 821/822, which is determined by the PVT-dependent control voltage Vrb, the bias voltage produced by bias circuit 830. The break frequency between the two operational domains is a function of the RC time constant of high-frequency peaking circuits 840b, where the effective value of R is also determined by Vrb controlling the channel resistance of active resistor 841.

As shown in FIG. 8, each high-frequency peaking circuit 840b connected to either active load transistor 821/822 may take the form of the representative circuit 840a shown in FIG. 8, where the active resistor 841 in 840a corresponds to the resistor shown in each instance of high-frequency gain stage 840b, and similarly the active capacitor 842 in 840a corresponds to the capacitor shown in each instance of high-frequency gain stage 840b. Thus, the outputs of 840a denoted by the arrows represent connections of each high-frequency gain stage 840b to the corresponding active load transistor 821/822. Furthermore, FIG. 8 includes an associated bias voltage supply 830. In operation, current source 831 incorporated into bias voltage supply 830 generates a scaled version $I_{BCtle/N}$ of the fixed bias current of current source 803, the scaled version of the fixed bias current being mirrored to active load transistors 821 or 822 of the CTLE differential amplifier 810. The geometry and functional characteristics of bias voltage supply transistors including replica active resistor 832 and replica load transistor 833 should be identical to those of transistors 841, 821, and 822, allowing variations of gate-to-source voltage Vgs in replica load transistor 833 over PVT to introduce corresponding compensations into Vrb generated by replica active resistor 832, negating comparable PVT variations of Vgs in active resistor 841 and active load transistors 821 and 822.

As there is no current drawn by high frequency gain stages 840b, multiple instances of high-frequency gain stage 840b may be driven by the PVT-dependent control voltage generated by a single instance of bias circuit 830. In the example illustrated in FIG. 8, there are two instances 840b of the resistor/capacitor high-frequency gain stage 840a, each instance of 840b connected to either active load transistor 821 or 822 as described above, thus "N" for $I_{BCtle/N}$ is 2. The impedance of active resistor 841 serves as the resistor in the R/C network associated with the frequency-dependent gain characteristics of the circuit, with the capacitance of transistor 842 serving as the capacitor.

A convenient embodiment providing configurable control of CTLE gain peaking utilizes multiple instances of high-frequency gain circuit 840*b* in parallel, in association with active load transistors 821 and 822. As one example, replacing each instance of high-frequency gain circuit 840*b* in FIG. 8 with four parallel instances (thus utilizing a total of 8 instances, with each having a "N=8 value for current source 831) maintains the same DC current characteristics, but increases the effective capacitance in the R/C network by a factor of four, increasing the overall gain peaking effect of the CTLE. One such embodiment controls the number of active instances by disabling or enabling active resistor 841 in different parallel instances. Other embodiments of 840*b* may utilize other known means of configuration for the Resistive, Capacitive, or both elements, without limitation.

As shown in FIG. 8, differential amplifier 810 is configured to generate a differential output signal Ctle+/Ctle− on a differential pair of output nodes. In some embodiments, the differential output signal Ctle+/Ctle− represent an appropriately weighted mixture (i.e., an analog linear combination) of inputs Vin<5:0> amplified by a frequency-selective gain as configured by high-frequency gain stages 840*b*. In some such embodiments, differential amplifier 810 may correspond to a multi-input comparator (MIC) configured to generate a linear combination of input signals Vin<5:0> according to a respective sub-channel vector of a plurality of mutually orthogonal sub-channel vectors. In some embodiments, the MIC may correspond to a plurality of differential pairs of transistors (e.g., a plurality of sets of 811/812). In such embodiments, weights may be applied via dimensions of the transistors 811/812, or a number of transistors connected in parallel that receive the same input signal from Vin<5:0>. Alternatively, portions of the linear combination may be generated by a passive MIC circuit as described in [Tajalli IV], the passive MIC generating a differential output signal that is provided directly to differential amplifier 810. In alternative embodiments, differential amplifier 810 may receive a differential non-return-to-zero (NRZ) signal, or various other types of differential signals including but not limited to PAM-3, PAM-4, or other PAM-M signals. In such multi-level PAM embodiments, additional slicing circuits having different thresholds may be connected to the CTLE circuits to detect the multiple levels. These differential output signals also incorporate the desired input bias level for the subsequent slicer input stage, as determined by $I_{BCtle}$, as described in more detail below.

The illustrated slicer input is a conventional dynamic integrator/sampler. Differential output nodes Integ000 and Integ180 are initialized by being pre-charged by transistors 851, 852, 853, 854 during a first clock phase determined by clock signals Ck and CkB. In a second clock phase, transistors 861, 862, 863, 864 drain the pre-charged nodes at a rate controlled by current sinks 871 and 872, proportionate to the mixed and amplified output of the Linear Combiner/CTLE, thus providing the desired integrated sampling function. It should be noted that alternative embodiments may pre-discharge differential output nodes Integ000 and Integ180, and subsequently charge the differential output nodes according to the input signal Ctle+/Ctle−. Observing that at low frequencies capacitor 842 acts essentially as an open circuit, it may be seen that there will be neither AC nor DC current flow through active resistor 841, implying that the voltage drop across it is essentially zero and therefore that the previously-described PVT compensation of Vgs for transistors 821 and 822 by bias circuit 830 also provides comparable control of Vgs for transistors 871 and 872, stabilizing the operating point of the slicer circuit current sinks over PVT as well. In other words, at low frequencies the voltage at the gates of active load transistors 821 and 822 is equal to the voltage at gates of transistors 871 and 872 in the slicing circuit. Therefore, the currents flowing in active load transistors 821/822 are effectively mirrored to the slicer current devices 871/872. The fixed bias reference current 803 thus also indirectly provides a reference for the slicer currents. This stabilization may also reduce variations in the effective integration time of the sampler circuit, thus reducing variations in the sampled outputs.

In one embodiment, PMOS transistors 801, 802, and 851, 852, 853, 854 are of identical size and characteristics, as are the transistors of differential pairs 811/812, 861/862, and 863/864. Similarly, NMOS transistors 821, 822, 871, 872, 832, 833, 841 are of identical size and characteristics. This close matching, along with the strong topological similarity between the linear, continuous time CTLE circuit and the dynamic Slicer input circuit facilitates close tracking of circuit characteristics over temperature and voltage. As a result, the bias level set by current source 803 for the CTLE input circuit is well matched to the input bias level required by the Slicer inputs over varying voltage and temperature. In some embodiments, this close matching may allow background calibration (for example, of slicer thresholds) to be eliminated or performed less frequently, leading to lower overall system power consumption.

Figure 9:
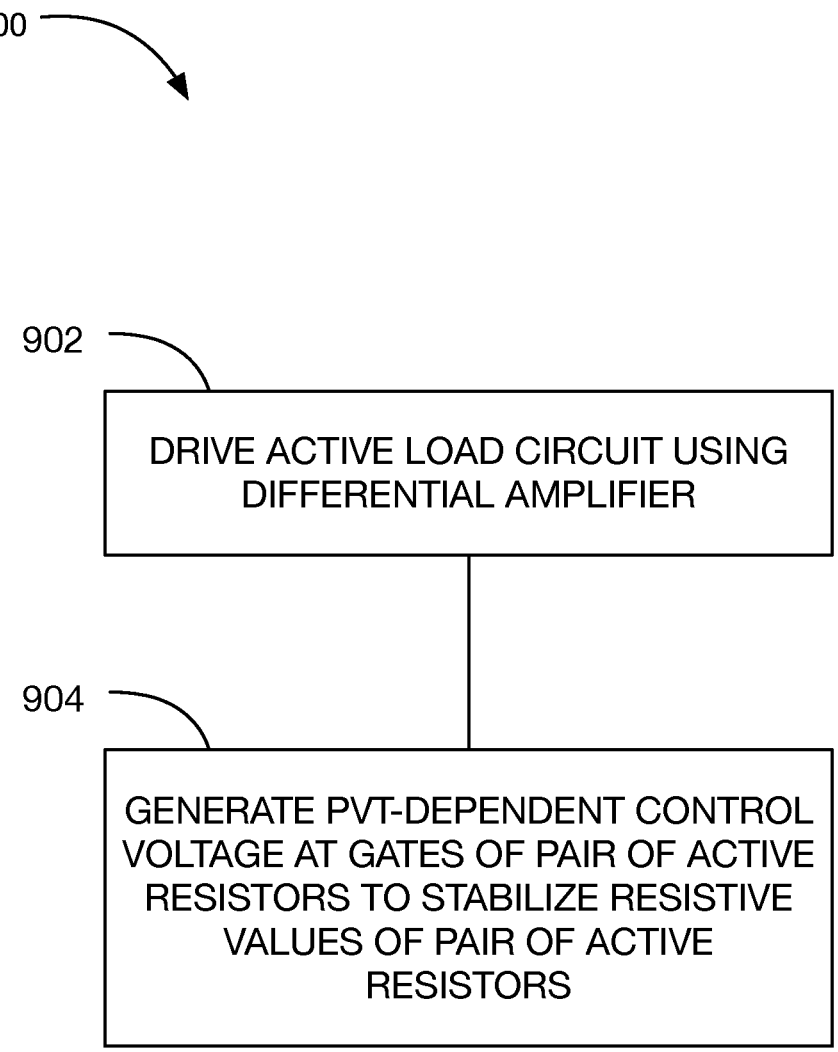
FIG. 9 is a flowchart of a method, in accordance with some embodiments.

FIG. 9 is a flowchart of a method 900, in accordance with some embodiments. As shown in FIG. 9, the method 900 includes driving 902 an active load circuit using a differential amplifier 810, the active load circuit having a pair of load transistors 821/822 and a high-frequency gain stage 840*b* providing high frequency peaking for the active load circuit according to a frequency response characteristic determined in part by resistive values of a pair of active resistors 841 connected, respectively, to gates of the pair of load transistors 821/822. Method 900 further includes generating 904, using bias circuit 830, a process-and-temperature variation (PVT)-dependent control voltage Vrb at gates of the active resistors 841 to stabilize the resistive values of the pair of active resistors to account for PVT-dependent voltages at the gates of the pair of load transistors, the PVT-dependent control voltage stabilizing the high frequency peaking of the high-frequency gain stage.

It should be noted that the term "circuit" may mean, among other things, a single component or a multiplicity of components, which are active and/or passive, and which are coupled together to provide or perform a desired function. The term "circuitry" may mean, among other things, a circuit, a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays.

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The embodiments described are also directed to such representation of the circuitry described herein, and/or techniques implemented thereby, and, as such, are intended to fall within the scope of the present embodiments.

Moreover, the various circuits and circuitry, as well as techniques, disclosed herein may be represented via simulations and simulation instruction-based expressions using computer aided design, simulation and/or testing tools. The simulation of the circuitry described herein, and/or techniques implemented thereby, may be implemented by a computer system wherein characteristics and operations of such circuitry, and techniques implemented thereby, are simulated, imitated, replicated, analyzed and/or predicted via a computer system. Simulations and testing of the devices and/or circuitry described herein, and/or techniques implemented thereby, and, as such, are intended to fall within the scope of the present embodiments. The computer-readable media and data corresponding to such simulations and/or testing tools are also intended to fall within the scope of the present embodiments.

We claim:

1. An apparatus comprising:
   a differential amplifier driving an active load circuit;
   the active load circuit having a pair of load transistors and a high-frequency gain stage providing high frequency peaking for the active load circuit according to a frequency response characteristic determined in part by resistive values of a pair of active resistors connected, respectively, to gates of the pair of load transistors; and
   a bias circuit configured to stabilize the high frequency peaking of the high-frequency gain stage by generating a process-and-temperature variation (PVT)-dependent control voltage at gates of the active resistors to stabilize the resistive values of the pair of active resistors to account for PVT-dependent voltages at the gates of the pair of load transistors, the bias circuit comprising a replica load transistor matched to the pair of load transistors, the replica load transistor configured to track the PVT-dependent voltage at the gate of the pair of load transistors.

2. The apparatus of claim 1, wherein the bias circuit comprises a replica active resistor matched to the pair of active resistors, the replica active resistor configured to generate the PVT-dependent control voltage at the gates of the active resistors.

3. The apparatus of claim 1, wherein the differential amplifier operates according to a fixed bias current, and wherein the bias circuit operates according to a scaled version of the fixed bias current.

4. The apparatus of claim 1, wherein the high-frequency gain stage comprises a plurality of active resistors connected in parallel.

5. The apparatus of claim 1, wherein the differential amplifier is configured to generate a differential output signal on a differential pair of output nodes connected to the active load circuit.

6. The apparatus of claim 5, wherein the differential amplifier is a multi-input comparator (MIC) configured to receive a set of at least three input signals and to responsively generate the differential output signal by forming a linear combination of the set of at least three input signals.

7. The apparatus of claim 6, wherein the set of at least three input signals and the linear combination are associated with a respective sub-channel vector of a plurality of mutually-orthogonal sub-channel vectors.

8. The apparatus of claim 5, further comprising a slicer circuit connected to the differential pair of output nodes, wherein the slicer circuit is driven in part by the PVT-dependent voltage at the gates of the pair of load transistors.

9. The apparatus of claim 1, wherein the PVT-dependent control voltage at the gates of the active resistors maintains a constant gate-source voltage across the active resistors relative to the PVT-dependent voltage at the gate of the load transistors.

10. A method comprising:
    driving an active load circuit using a differential amplifier, the active load circuit having a pair of load transistors and a high-frequency gain stage providing high frequency peaking for the active load circuit according to a frequency response characteristic determined in part by resistive values of a pair of active resistors connected, respectively, to gates of the pair of load transistors; and
    generating, using a bias circuit, a process-and-temperature variation (PVT)-dependent control voltage at gates of the active resistors to stabilize the resistive values of the pair of active resistors to account for PVT-dependent voltages at the gates of the pair of load transistors, wherein generating the PVT-dependent control voltage comprises tracking the PVT-dependent voltage at the gate of the pair of load transistors using a replica load transistor in the bias circuit, the replica load transistor matched to the pair of load transistors, the PVT-dependent control voltage stabilizing the high frequency peaking of the high-frequency gain stage.

11. The method of claim 10, wherein the PVT-dependent control voltage is generated by a replica active resistor in the bias circuit matched to the pair of active resistors.

12. The method of claim 10, wherein the active load circuit is driven according to a fixed bias current, and wherein the PVT-dependent control voltage is generated using a scaled version of the fixed bias current.

13. The method of claim 10, wherein the high-frequency peaking for the active load circuit is tunable.

14. The method of claim 10, wherein driving the active load circuit comprising generating a differential output signal on a differential pair of output nodes.

15. The method of claim 14, wherein generating the differential output signal comprises receiving a set of at least three input signals at a multi-input comparator (MIC) and responsively generating the differential output signal as a linear combination of the set of at least three input signals.

16. The method of claim 15, wherein the set of at least three input signals and the linear combination are associated with a respective sub-channel vector of a plurality of mutually-orthogonal sub-channel vectors.

17. The method of claim 14, wherein the differential pair of output nodes drive a slicer circuit connected to the differential pair of output nodes, wherein the slicer circuit is driven in part by the PVT-dependent voltage at the gates of the pair of load transistors.

18. The method of claim 10, wherein the PVT-dependent control voltage at the gates of the active resistors maintains a constant gate-source voltage across the active resistors relative to the PVT-dependent voltage at the gate of the load transistors.

\* \* \* \* \*